(12) United States Patent
Chung et al.

(10) Patent No.: US 6,459,151 B1
(45) Date of Patent: Oct. 1, 2002

(54) STRUCTURE AND PROCESS OF VIA CHAIN FOR MISALIGNMENT TEST

(75) Inventors: Chi-Long Chung; Eddie Chiu; Chun-Lin Chen; Sheng-Fen Chiu, all of Hsinchu (TW)

(73) Assignee: ProMos Technologies Inc. (TW)

( * ) Notice: Subject to any disclaimer, the term of this patent is extended or adjusted under 35 U.S.C. 154(b) by 0 days.

(21) Appl. No.: 09/710,624

(22) Filed: Nov. 10, 2000

(30) Foreign Application Priority Data

Sep. 15, 2000 (TW) ........................................ 89119013 A

(51) Int. Cl.[7] .......................................... H01L 21/4763
(52) U.S. Cl. ........................................ 257/734; 438/627
(58) Field of Search .......................... 438/627; 257/734

(56) References Cited

U.S. PATENT DOCUMENTS 4,670,091 A * 6/1987 Thaomas et al.
6,320,396 B1 * 11/2001 Nikawa
2001/0001427 A1 * 5/2001 Atakov et al.
2001/0015464 A1 * 8/2001 Tamaki

OTHER PUBLICATIONS

"Intertwined Integrated Circuit Testing Chain" IBM Technical Disclosure Bulletin, Feb. 1986, US, vol. 28, pp. 3959–3960.*

"Test Structure for Semiconductor Chips", IBM Technical Disclosure Bulletin, Aug., 1976, vol. 19, pp. 898–899.*

* cited by examiner

Primary Examiner—George Fourson
Assistant Examiner—Thanh Pham
(74) Attorney, Agent, or Firm—MacPherson Kwok Chen & Heid LLP

(57) ABSTRACT

A structure or a process of the via chain is employed to test the misalignment. The structure of the via chain includes a first via chain in the first direction and a second via chain in the second direction. Using the structure having the via chains in two different directions, the misalignment can be easily detected.

9 Claims, 4 Drawing Sheets

The via contact

The first via chain in the first direction

The second via chain in the second direction

The lower metal line

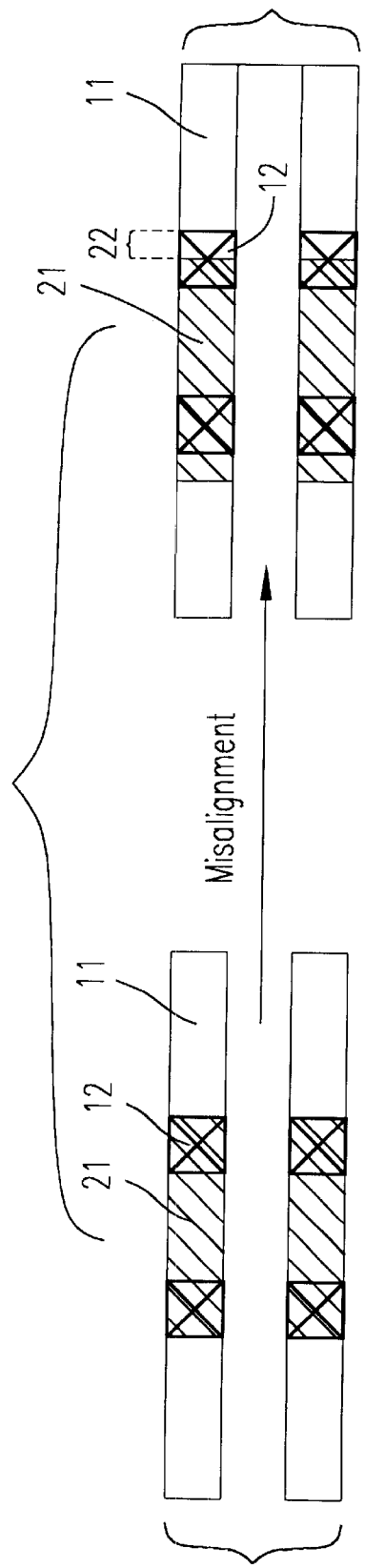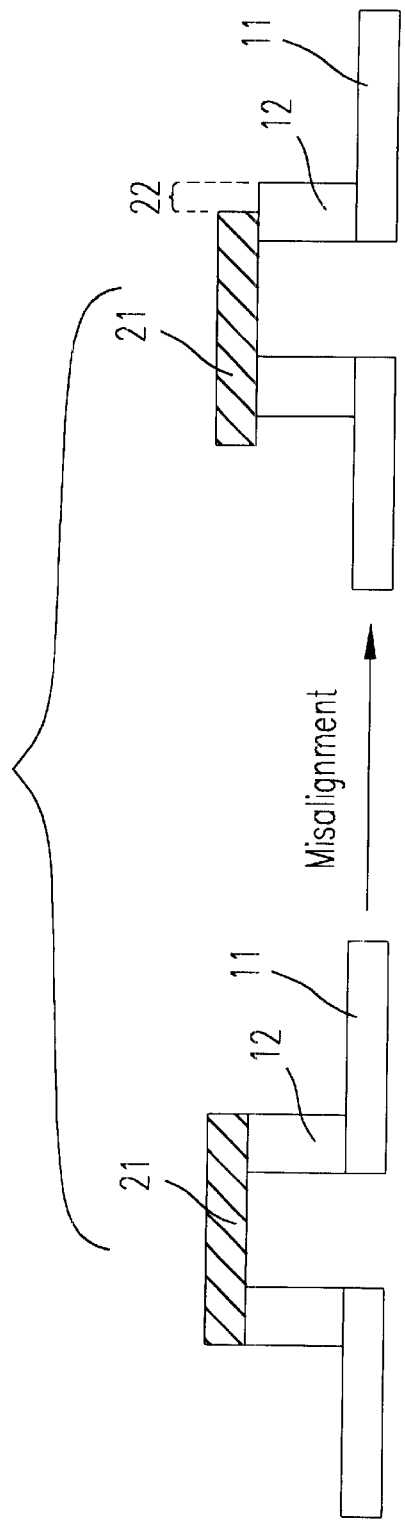
Fig. 2A (PRIOR ART)
Fig. 2B (PRIOR ART)

US 6,459,151 B1

STRUCTURE AND PROCESS OF VIA CHAIN FOR MISALIGNMENT TEST

FIELD OF THE INVENTION

The present invention relates to a structure or a process of via chain, especially for testing the misalignment in the semiconductor process.

BACKGROUND OF THE INVENTION

In the semiconductor process, the via chain is a common structure for testing. Generally, for being easy to test, the process of the integrated circuit will add some test keys on the edge region of the integrated circuit. Owing to the fact that the test keys are almost connected to the register devices used for testing, the signal lines are generally connected to each other in series or parallel connections. Therefore, it forms a regular via chain.

FIG. 1 is the structure of via chain according to the prior art. The via chain is formed by the upper metal line 13, the via 12, and the lower metal line 11. The diameters of the metal lines 11 and 13 are bigger than that of the via 12, so there is no alignment problem exists. Thus, a certain level misalignment is acceptable in the processing. However, through the process advancement, the diameter of metal line is smaller and smaller. Therefore, the structure that the diameter of the via chain is bigger than that of the via cannot meet the demand of the current technology of semiconductor manufacturing.

FIGS. 2A and 2B are also the structure of via chain according to the prior art. As shown in FIG. 2, the diameters of the upper metal line 21 and the lower metal line 11 are changed to be very small. However, the diameter of the via 12 cannot be reduced under the current process technology. Thus, the width of the dielectric layer is the same as that of the metal line, sometime even bigger.

FIG. 2A is a top view. The left side view is the accurate condition of alignment of the upper metal line 21 and the via 12. Upon accurate alignment, basically, the upper metal line 21 will completely cover the left and right vias 12. However, due to the fact that the traditional structure of via chain is arranged in a single direction, the upper metal line 21 will shift for a distance 22 when there is a misalignment (see the right side view of FIG. 2A). The misalignment causes the right via 12 to be incompletely covered by the upper metal line 21. The slight shifted distance definitely affects the reliability and the yield of the process. However, as FIG. 2B showing the structural cross-section of via chain, the misalignment cannot be accurately detected because the via chain is still in the connecting condition even if there is a slight shifted distance 22 (see the right side view of FIG. 2B).

Thus, after the development of the traditional semiconductor process, it causes the troubling situation that the misalignment of via chain cannot be accurately determined. Therefore, it will cause the significant defects in reliability and yield in the process.

It is therefore tried by the applicant to deal with the above situation encountered in the prior art.

SUMMARY OF THE INVENTION

It is therefore an object of the present invention to propose a structure of the via chain to accurately detect the misalignment for assuring the reliability and yield.

It is therefore another object of the present invention to propose a process of producing the via chain for accurately detecting the misalignment.

According to the present invention, a structure of a via chain for misalignment test comprises a substrate, a first via chain formed on the substrate in a first direction, and a second via chain formed on the substrate in a second direction, thereby enabling the misalignment test.

Certainly, the substrate can be a semiconductor substrate. The first via chain comprises a first metal section, two vias, and a second metal section, and the first metal section and second metal section are in a first direction. The first metal section and second metal section is formed of a first chain structure by connecting with said vias. The second via chain comprises a third metal section, two vias, and a fourth metal section, and the third metal section and fourth metal section are in a second direction. The third metal section and fourth metal section is formed of a second chain structure by connecting with said vias.

Preferably, the first via chain is perpendicular to said second via chain.

According to another aspect of the present invention, a process of forming a via chain for misalignment test comprises providing a substrate, forming a first via chain on the substrate in a first direction, and forming a second via chain on the substrate in a second direction.

According to additional aspect of the present invention, a process of forming a via chain for misalignment test comprises providing a substrate, and forming a first via chain on the substrate in a first direction and a second via chain on the substrate in a second direction simultaneously.

The present invention may best be understood through the following description with reference to the accompanying drawings, in which:

BRIEF DESCRIPTION OF THE DRAWINGS

FIGS. 2A–2B are the top view and the cross-sectional view of the structure of the small diameter via chain according to the prior art.

DETAILED DESCRIPTION OF THE PREFERRED EMBODIMENT

Figure 1:
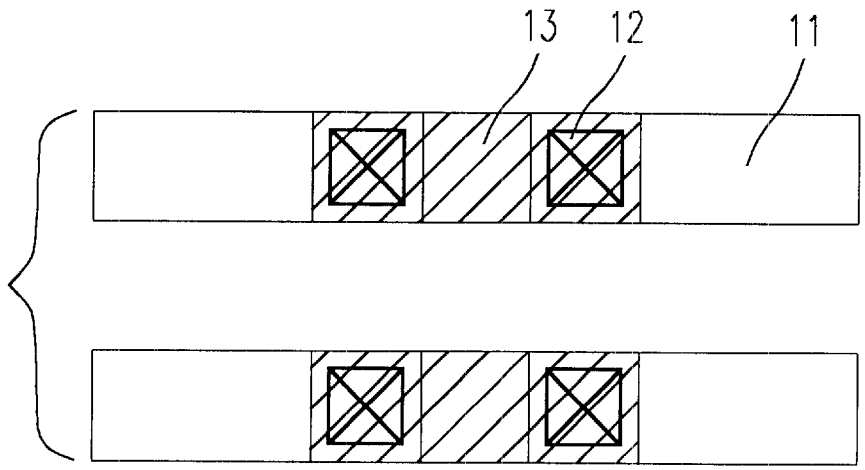
FIG. 1 is a top view of the structure of the big diameter via chain according to the prior art.
Figure 3A:
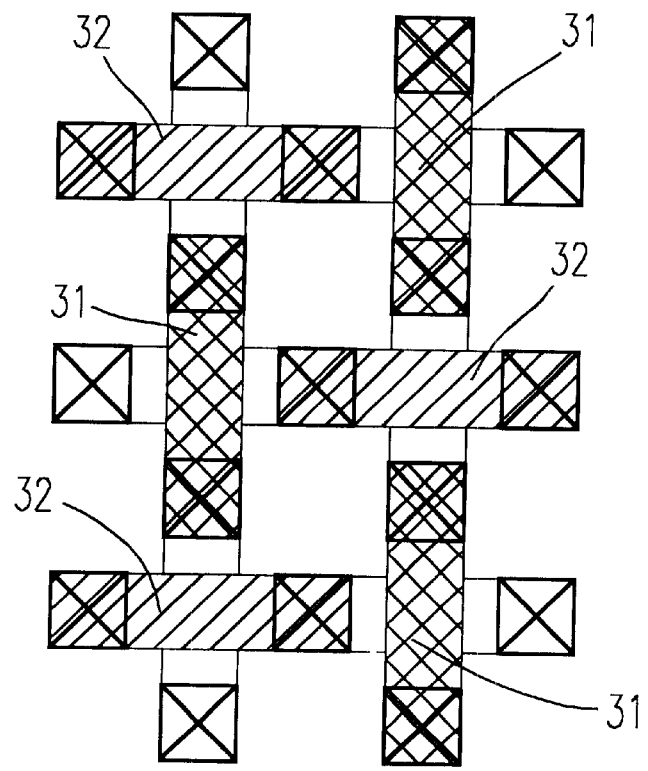
FIGS. 3A–3B are the top views of the via chain with two different directions according to a preferred embodiment of the present invention.
Figure 3B:
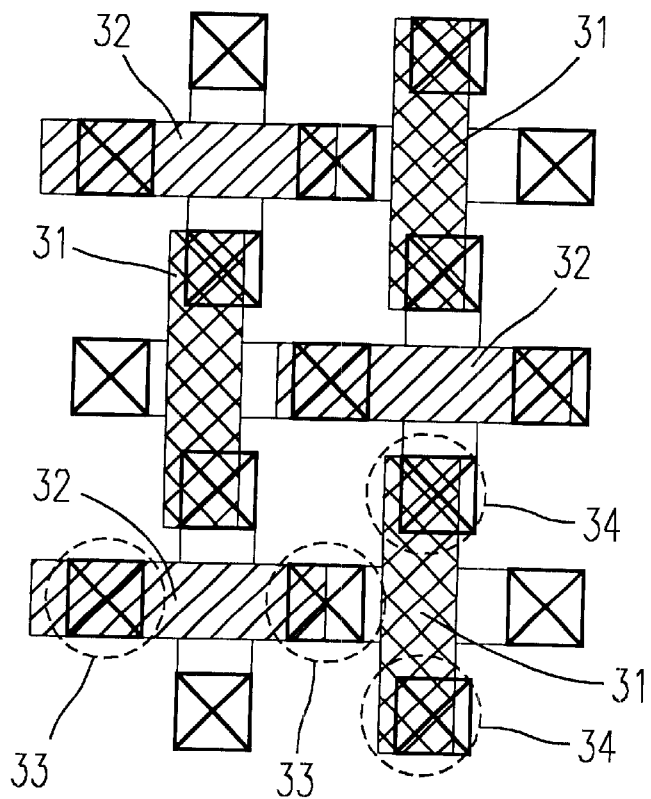

FIGS. 3A–3B are the top views of the structure of via chain for testing the misalignment according to a preferred embodiment of the present invention. FIG. 3A shows the alignment condition. Upon alignment, the upper metal line, the via, and the lower metal line of the first via chain 31 is under the same diameter basically. That is, the via is disposed on the lower metal line and the upper metal line is disposed on the via. In addition, the via is completely covered by the upper metal line.

As shown in FIG. 3B, there is shown a misalignment condition in the process. Upon misalignment, the upper metal line shifts to the left slightly, the metal lines of both the first via chain and the second via chain cannot cover the via completely. Among the vias, both the first misalignment condition 33 and the second misalignment condition 34 can be found. It is impossible to detect the first misalignment condition 33 for just the same reasons in the prior art shown in FIGS. 2A and 2B. However, the second misalignment condition can be easily detected by determining the electrical property resulting from the alignment shift of two neighboring vias. Consequently, when the misalignment happens in the process, it must be able to detect the misalignment in one direction of the via chains with the provisions of via chains in two different directions. Thus, the present invention, which can assure the integrated circuit production without the misalignment problem, results in the increasing of the reliability of the integrated circuit. At the same time, owing to the positive detection of the misalignment, the misalignment condition will be ascertained. Therefore, the process yield will be increased, too.

The present invention is adapted to be used to test the misalignment by providing a substrate, especially for the semiconductor substrate, and forming a first via chain in the first direction and a second via chain in the second direction. Certainly, the preferred condition is that the via chains in two directions are perpendicular to each other. In addition, the via chains in two directions can be formed at the same time in the process.

Owing to the above descriptions, the advantages of the present invention are summarized as follows:

(1) The present invention provides a great testing environment by the via chains having two different directions. Because when the misalignment condition happens in the process, it can be easily detected.
(2) The present invention can increase the reliability and the yield of the process by improving the structure and the process of the via chain.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A structure of a via chain for misalignment test, comprising:

a substrate;

a first via chain formed on said substrate in a first direction, wherein said first via chain comprises a first metal section, two first vias, and a second metal section, and wherein said first metal section and said second metal section are in said first direction; and a second via chain formed on said substrate in a second direction perpendicular to said first direction, wherein said second via chain comprises a third metal section, two second vias, and a fourth metal section, and wherein said third metal section and said fourth metal section are in said second direction, such that said misalignment test can be performed.

2. The structure according to claim 1, wherein said substrate is a semiconductor substrate.

3. The structure according to claim 1, wherein said first metal section and said second metal section form a first chain structure by connecting with said first vias.

4. The structure according to claim 1 wherein said third metal section and said fourth metal section form a second chain structure by connecting with said second vias.

5. A process of forming a via chain for misalignment test, comprising:

providing a substrate;

forming a first via chain on said substrate in a first direction, wherein said first via chain comprises a first metal section, two first vias, and a second metal section, wherein said first metal section and said second metal section are in said first direction; and forming a second via chain on said substrate in a second direction perpendicular to said first direction, wherein said second via chain comprises a third metal section, two second vias, and a fourth metal section, wherein said third metal section and said fourth metal section are in said second direction.

6. The process according to claim 5, wherein the steps of said forming a first via chain and said forming a second via chain are performed simultaneously.

7. The process according to claim 5, wherein said substrate is a semiconductor substrate.

8. The process according to claim 5, wherein said first metal section and said second metal section form a first chain structure by connecting with said first vias.

9. The process according to claim 5, wherein said third metal section and said fourth metal section form a second chain structure by connecting with said second vias.

* * * * *